United States Patent
Rubin et al.

(10) Patent No.: US 11,133,259 B2
(45) Date of Patent: Sep. 28, 2021

(54) MULTI-CHIP PACKAGE STRUCTURE HAVING HIGH DENSITY CHIP INTERCONNECT BRIDGE WITH EMBEDDED POWER DISTRIBUTION NETWORK

(71) Applicant: International Business Machines Corporation, Armonk, NY (US)

(72) Inventors: Joshua M. Rubin, Albany, NY (US); Arvind Kumar, Chappaqua, NY (US); Lawrence A. Clevenger, Saratoga Springs, NY (US); Steven Lorenz Wright, Tucson, AZ (US); Wiren Dale Becker, Hyde Park, NY (US); Xiao Hu Liu, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 16/712,231

(22) Filed: Dec. 12, 2019

(65) Prior Publication Data
US 2021/0183773 A1 Jun. 17, 2021

(51) Int. Cl.
*H01L 23/48* (2006.01)
*H01L 23/34* (2006.01)
(Continued)

(52) U.S. Cl.
CPC ...... *H01L 23/5383* (2013.01); *H01L 21/4846* (2013.01); *H01L 23/49838* (2013.01);
(Continued)

(58) Field of Classification Search
CPC ............ H01L 25/0655; H01L 25/0657; H01L 2224/73265; H01L 2224/3245;
(Continued)

(56) References Cited

U.S. PATENT DOCUMENTS 8,227,904 B2    7/2012  Braunisch et al.
8,901,748 B2 *  12/2014 Manusharow .......... H01L 24/20
(Continued)

FOREIGN PATENT DOCUMENTS

WO    2017111957 A1    6/2017
WO    2018048443 A1    3/2018
WO    2019066848 A1    4/2019

OTHER PUBLICATIONS

Y. Zhang, "Power Delivery Network Benchmarking for Interposer and Bridge-Chip-Based 2.5-D Integration," IEEE Electron Device Letters, Jan. 2018, pp. 99-102, vol. 39, No. 1.
(Continued)

*Primary Examiner* — Alonzo Chambliss
(74) *Attorney, Agent, or Firm* — Jeffrey S. LaBaw; Ryan, Mason & Lewis, LLP

(57) ABSTRACT

A multi-chip package structure includes a package substrate, an interconnect bridge device, first and second integrated circuit chips, and a connection structure. The first integrated circuit chip is flip-chip attached to at least the interconnect bridge device. The second integrated circuit chip is flip-chip attached to the interconnect bridge device and to the package substrate. The interconnect bridge device includes (i) wiring that is configured to provide chip-to-chip connections between the first and second integrated circuit chips and (ii) an embedded power distribution network that is configured to distribute at least one of a positive power supply voltage and a negative power supply voltage to at least one of the first and second integrated circuit chips attached to the interconnect bridge device. The connection structure (e.g., wire bond, injection molded solder, etc.) connects the embedded power distribution network to a power supply voltage contact of the package substrate.

20 Claims, 13 Drawing Sheets

(51) Int. Cl.

| | |
|---|---|
| *H01L 21/00* | (2006.01) |
| *H01L 21/4763* | (2006.01) |
| *H01L 23/538* | (2006.01) |
| *H01L 25/18* | (2006.01) |
| *H01L 21/48* | (2006.01) |
| *H01L 23/00* | (2006.01) |
| *H01L 23/498* | (2006.01) |
| *H01L 25/065* | (2006.01) |

(52) U.S. Cl.
CPC .......... *H01L 23/5386* (2013.01); *H01L 24/14* (2013.01); *H01L 24/16* (2013.01); *H01L 24/17* (2013.01); *H01L 24/24* (2013.01); *H01L 24/49* (2013.01); *H01L 24/81* (2013.01); *H01L 25/0655* (2013.01); *H01L 25/0657* (2013.01); *H01L 25/18* (2013.01); *H01L 2224/16157* (2013.01); *H01L 2224/32145* (2013.01); *H01L 2224/73265* (2013.01)

(58) Field of Classification Search
CPC ................ H01L 24/81; H01L 23/5383; H01L 23/49838; H01L 25/18; H01L 21/4846; H01L 24/16; H01L 2224/32145; H01L 24/49; H01L 23/5386; H01L 24/14; H01L 24/24; H01L 24/17
See application file for complete search history.

(56) References Cited

U.S. PATENT DOCUMENTS

| | | | |
|---|---|---|---|
| 9,496,154 B2 | 11/2016 | Tosaya et al. | |
| 9,640,521 B2 | 5/2017 | Chang et al. | |
| 10,832,942 B2* | 11/2020 | Leobandung | H01L 24/92 |
| 2009/0273098 A1* | 11/2009 | Bartley | H01L 24/13 |
| | | | 257/778 |
| 2012/0061856 A1* | 3/2012 | Vora | H01L 23/5386 |
| | | | 257/782 |
| 2012/0280755 A1* | 11/2012 | Wright | H03F 1/565 |
| | | | 330/307 |
| 2013/0193581 A1* | 8/2013 | Roberts | H01L 21/50 |
| | | | 257/773 |
| 2015/0318236 A1* | 11/2015 | Zhang | H01L 24/81 |
| | | | 257/773 |
| 2016/0095219 A1* | 3/2016 | Sakamoto | H01L 24/14 |
| | | | 361/767 |
| 2016/0372448 A1* | 12/2016 | Yazdani | H01L 23/04 |
| 2018/0182699 A1 | 6/2018 | Lai et al. | |
| 2018/0240778 A1 | 8/2018 | Liu et al. | |
| 2018/0331042 A1 | 11/2018 | Manusharow et al. | |
| 2019/0019754 A1 | 1/2019 | Haba | |

OTHER PUBLICATIONS

T.X. Lee et al., "Light extraction analysis of GaN-based light-emitting diodes with surface texture and/or patterned substrate," Optics Express, May 28, 2007, pp. 6670-6676, vol. 15, No. 11.

* cited by examiner

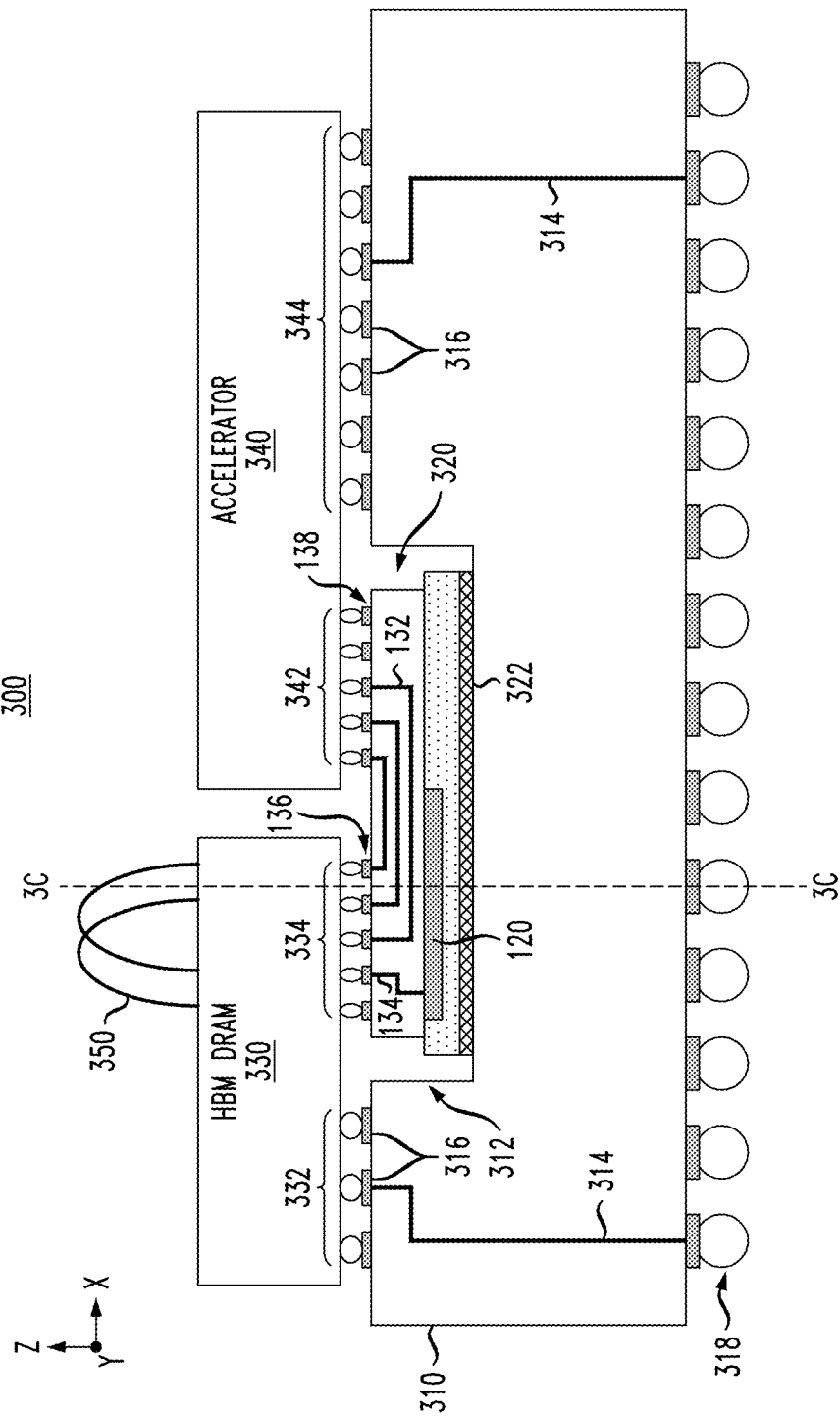

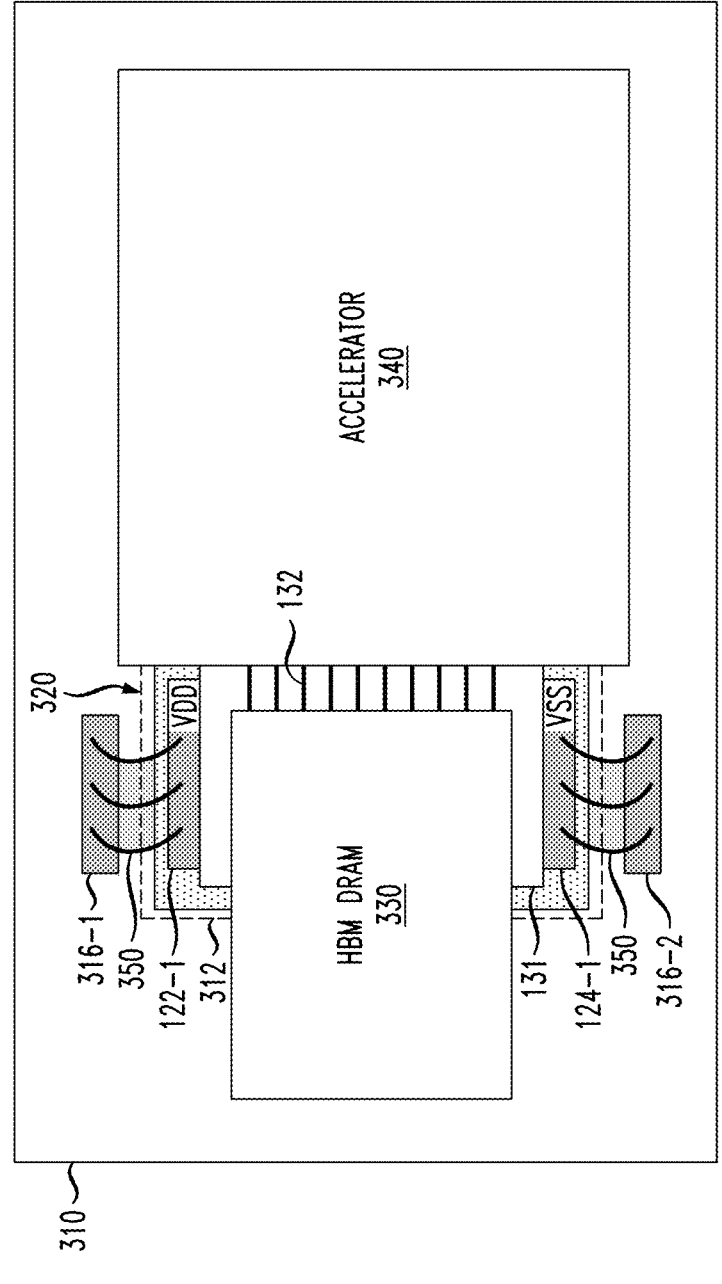

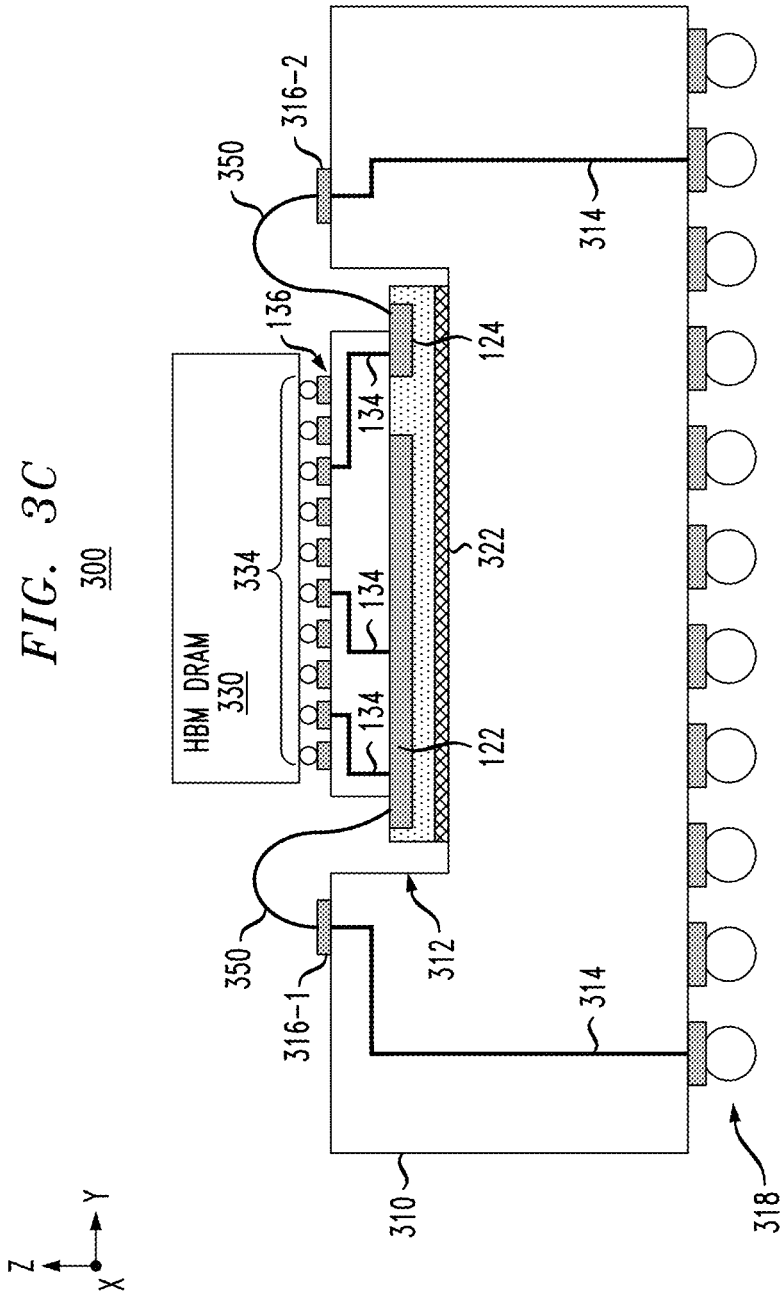

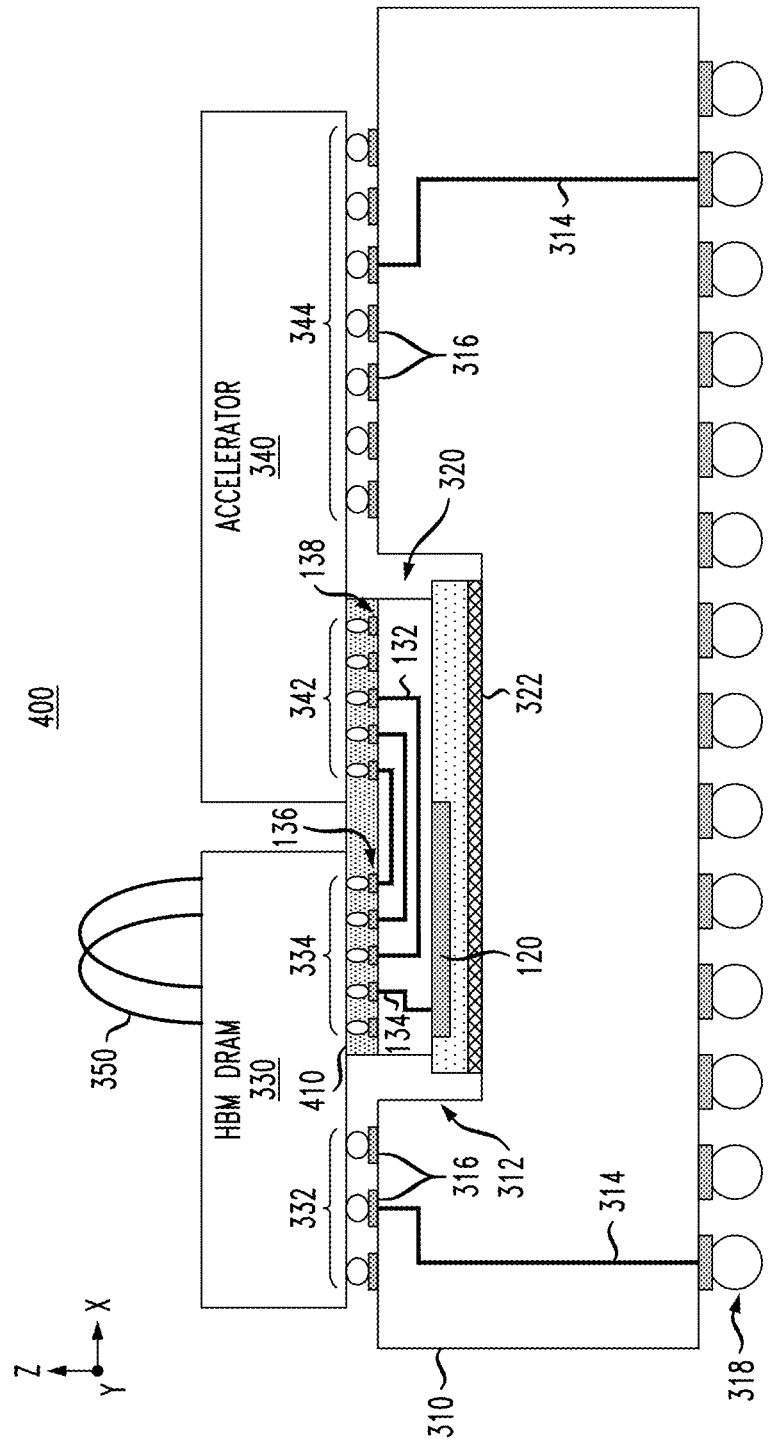

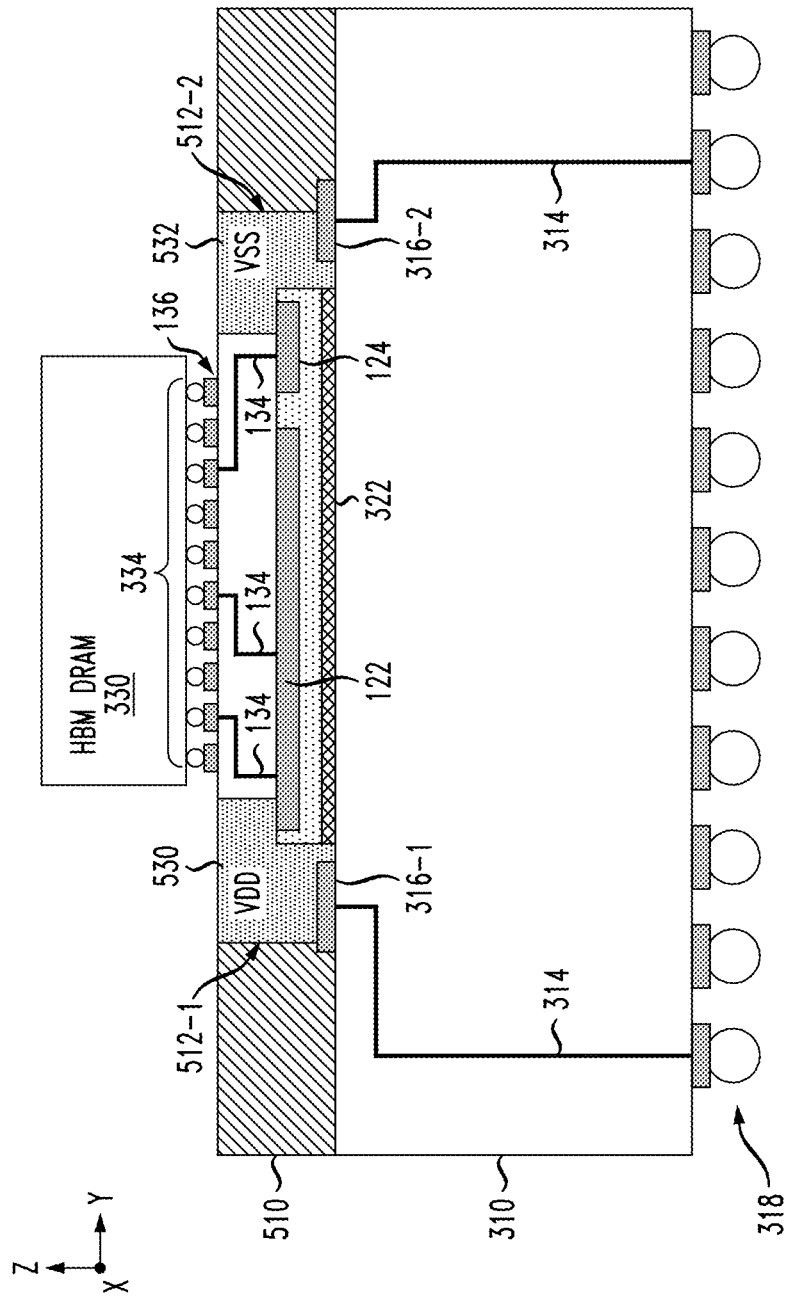

MULTI-CHIP PACKAGE STRUCTURE HAVING HIGH DENSITY CHIP INTERCONNECT BRIDGE WITH EMBEDDED POWER DISTRIBUTION NETWORK

TECHNICAL FIELD

This disclosure generally relates to semiconductor packaging techniques and, in particular, to multi-chip package structures which implement chip interconnect bridge devices.

BACKGROUND

Innovations in semiconductor fabrication and packaging technologies have enabled the development of smaller scale, higher density integrated circuit (IC) dies (referred to herein as IC chips), as well as the development of highly integrated chip modules with wiring and area array input/output (I/O) contact densities that enable dense packaging of IC chips. For certain applications, high-performance electronic modules are constructed with one or more multi-chip modules (MCMs) mounted to a circuit board (e.g., a system board (or node card), a printed circuit board, a printed wiring board, etc.) using a suitable area array connection technique for module-to-board I/O interconnections (e.g., land grid array (LGA) or ball grid array (BGA) connections).

Various conventional techniques can be utilized to construct an MCM package structure. For example, an MCM package can be constructed by connecting multiple semiconductor IC chips directly to a package substrate. For higher-density packaging, 2.5-D packaging techniques can be utilized to increase I/O density and provide high-density routing for chip-to-chip communication. For example, 2.5D packaging solutions utilize silicon interposers or silicon bridge devices to provide high-density interconnect density between adjacent chips. Silicon bridge devices are lower in cost than conventional silicon interposers as silicon bridge devices are much smaller (they only connect to peripheral regions of adjacent dies) and do not utilize costly through silicon vias (TSVs). Conventional bridge devices are typically designed to only include chip-to-chip interconnect wiring, but not wiring for, e.g., power distribution through the bridge device from the package substrate to the IC chips connected to the bridge device.

SUMMARY

Embodiments of the disclosure include multi-chip package structures which comprise a chip interconnection bridge device with an embedded power distribution network that is configured to distribute power from a package substrate to one or more integrated circuit chips connected to the chip interconnection bridge device.

For example, an embodiment includes a package structure which comprises a package substrate, an interconnect bridge device, a first integrated circuit chip, a second integrated circuit chip, and a connection structure. The first integrated circuit chip is flip-chip attached to at least the interconnect bridge device. The second integrated circuit chip is flip-chip attached to the interconnect bridge device and to the package substrate. The interconnect bridge device comprises (i) wiring that is configured to provide chip-to-chip connections between the first and second integrated circuit chips and (ii) an embedded power distribution network that is configured to distribute at least one of a positive power supply voltage and a negative power supply voltage to at least one of the first and second integrated circuit chips attached to the interconnect bridge device. The connection structure connects the embedded power distribution network to a power supply voltage contact of the package substrate.

Another embodiment includes a bridge device which comprises a bridge substrate, an interconnect structure, and an embedded power distribution network disposed between the bridge substrate and the interconnect structure. The interconnect structure comprises (i) a first array of contact pads and a second array of contact pads disposed on an upper surface of the interconnect structure, (ii) high-density wiring that provides connections between contacts pads of the first array of contact pads and the second array of contact pads, and (iii) power distribution traces that provide connections between the embedded power distribution network and one or more contact pads of at least one of the first array of contact pads and the second array of contact pads. The interconnect structure comprises an opened region which exposes a portion of the embedded power distribution network. The exposed portion of the embedded power distribution network comprises a contact area that is configured to enable contact to the embedded power distribution network.

Another embodiment includes a method for constructing a bridge device. A dielectric layer is formed on a substrate. An embedded power distribution network is formed in the dielectric layer. An interconnect structure is formed over the embedded power distribution network, wherein the interconnect structure comprises (i) a first array of contact pads and a second array of contact pads disposed on an upper surface of the interconnect structure, (ii) high-density wiring that provides connections between contacts pads of the first array of contact pads and the second array of contact pads, and (iii) power distribution traces that provide connections between the embedded power distribution network and one or more contact pads of at least one of the first array of contact pads and the second array of contact pads. The interconnect structure is patterned to form an opening that exposes a portion of the embedded power distribution network, wherein the exposed portion of the embedded power distribution network comprises a contact area that is configured to enable contact to the embedded power distribution network.

Other embodiments will be described in the following detailed description of embodiments, which is to be read in conjunction with the accompanying figures.

BRIEF DESCRIPTION OF THE DRAWINGS

FIGS. 1A, 1B and 1C are schematic views of a chip interconnect bridge device with an embedded power distribution network, according to an exemplary embodiment of the disclosure, wherein:

FIG. 1A is a schematic side view of the chip interconnect bridge device;

FIG. 1B is a schematic top plan view of the chip interconnect bridge device shown in FIG. 1A; and FIG. 1C is a plan view of the chip interconnect bridge device 100 along line 1C-1C in FIG. 1A.

FIG. 3A is a schematic cross-sectional side view of a multi-chip package structure comprising a chip interconnect bridge device, according to an embodiment of the disclosure.

FIG. 3B is a schematic top plan view of the multi-chip package structure of FIG. 3A.

FIG. 3C is a schematic cross-sectional side view of the multi-chip package structure along line 3C-3C shown in FIG. 3A.

FIG. 4 is a schematic cross-sectional side view of a multi-chip package structure comprising a chip interconnect bridge device, according to another embodiment of the disclosure.

FIG. 6 is a schematic cross-sectional side view of a multi-chip package structure comprising a chip interconnect bridge device, according to another embodiment of the disclosure.

FIGS. 7A, 7B, 7C, 7D, and 7E schematically illustrate a method for fabricating a chip interconnect bridge device with an embedded power distribution network, according to an embodiment of the disclosure, wherein:

FIG. 7A is a cross-sectional side view of an interconnect bridge wafer structure at an intermediate stage of fabrication comprising a bridge substrate and a dielectric layer formed on the surface of the bridge substrate;

FIG. 7B is a cross-sectional side view of the intermediate structure of FIG. 7A after forming an embedded power distribution network within the dielectric layer;

FIG. 7C is a cross-sectional side view of the intermediate structure of FIG. 7B after forming a dielectric capping layer to cover exposed metallization of the power distribution network;

FIG. 7D is a cross-sectional side view of the intermediate structure of FIG. 7C after forming an interconnect structure over the embedded power distribution network; and FIG. 7E is a cross-sectional side view of the intermediate structure of FIG. 7D after patterning the interconnect structure and the capping layer to form an opening which exposes a portion of the embedded power distribution network.

DETAILED DESCRIPTION

Figure 1A:
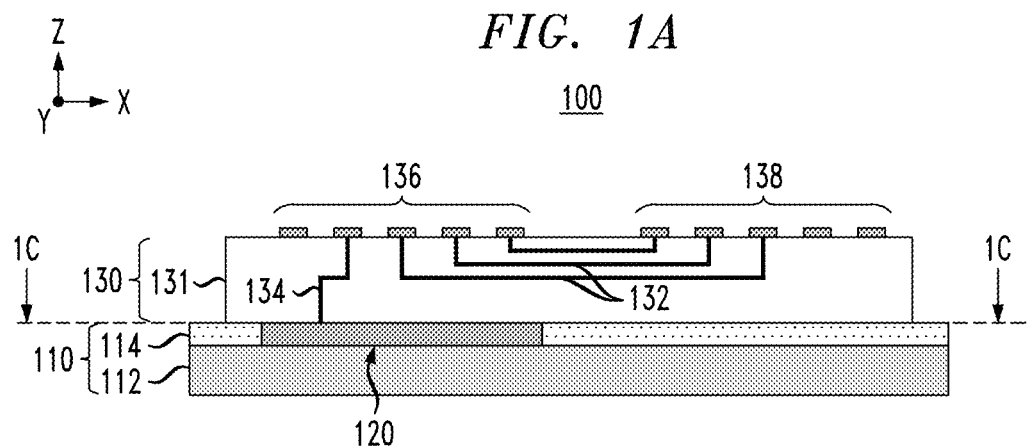

Embodiments of the disclosure will now be discussed in further detail with regard to multi-chip package structures having chip interconnection bridge devices. A chip interconnection bridge device comprises high-density chip-to-chip wiring configured to provide high I/O interconnect density between IC chips connected to the chip interconnection bridge device, as well as an embedded power distribution network and power distribution traces configured to distribute positive and/or negative power supply voltage from a package substrate to one or more of the IC chips connected to the chip interconnection bridge device. Embodiments of the disclosure address disadvantages of conventional bridge devices which only include chip-to-chip interconnect wiring, and which are devoid of wiring for distributing power through the bridge device from the package substrate to the IC chips connected to the bridge device. With increasing IC chip functionality and density, there is a need for an IC chip to have an increasing number of power and ground pins to distribute power and minimize ground bounce. As such, IC chips are typically fabricated with power/ground pads that are dispersed over the area array of I/O contact pads on the active sides of the IC chips. When a conventional bridge device is used for high-density chip-to-chip I/O connections, the conventional bridge device blocks power distribution from a package substrate through the bridge device to power/ground pads that are disposed within high-density I/O regions of the IC chips that are overlapped by the bridge device. As such, connections to these power/ground pads must be made from the package substrate to other regions of the IC chips which are not overlapped by the bridge device, and then routed through the IC chips (as well as through lateral interconnect wiring in the bridge device) to the power/ground pads that are blocked by the bridge device. This conventional configuration increases the length of power/ground traces, which increases the IR voltage drop and, thus, the IR heating within the package structure. In accordance with embodiments of the disclosure, a chip interconnection bridge device is designed to include an embedded power distribution network which allows positive and/or negative power supply voltage to be routed from a package substrate, through the chip interconnection bridge device, to contact pads of IC chips in regions of the IC chips which overlap the chip interconnection bridge device.

It is to be understood that the various layers, structures, and regions shown in the accompanying drawings are schematic illustrations that are not drawn to scale. In addition, for ease of explanation, one or more layers, structures, and regions of a type commonly used to form devices or package structures may not be explicitly shown in a given drawing. This does not imply that any layers, structures, and regions not explicitly shown are omitted from the actual devices or structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form functional devices or complete package structures. Rather, certain processing steps that are commonly used in forming semiconductor devices and structures are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

To provide spatial context to the different structural orientations of the semiconductor structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

Figure 1B:
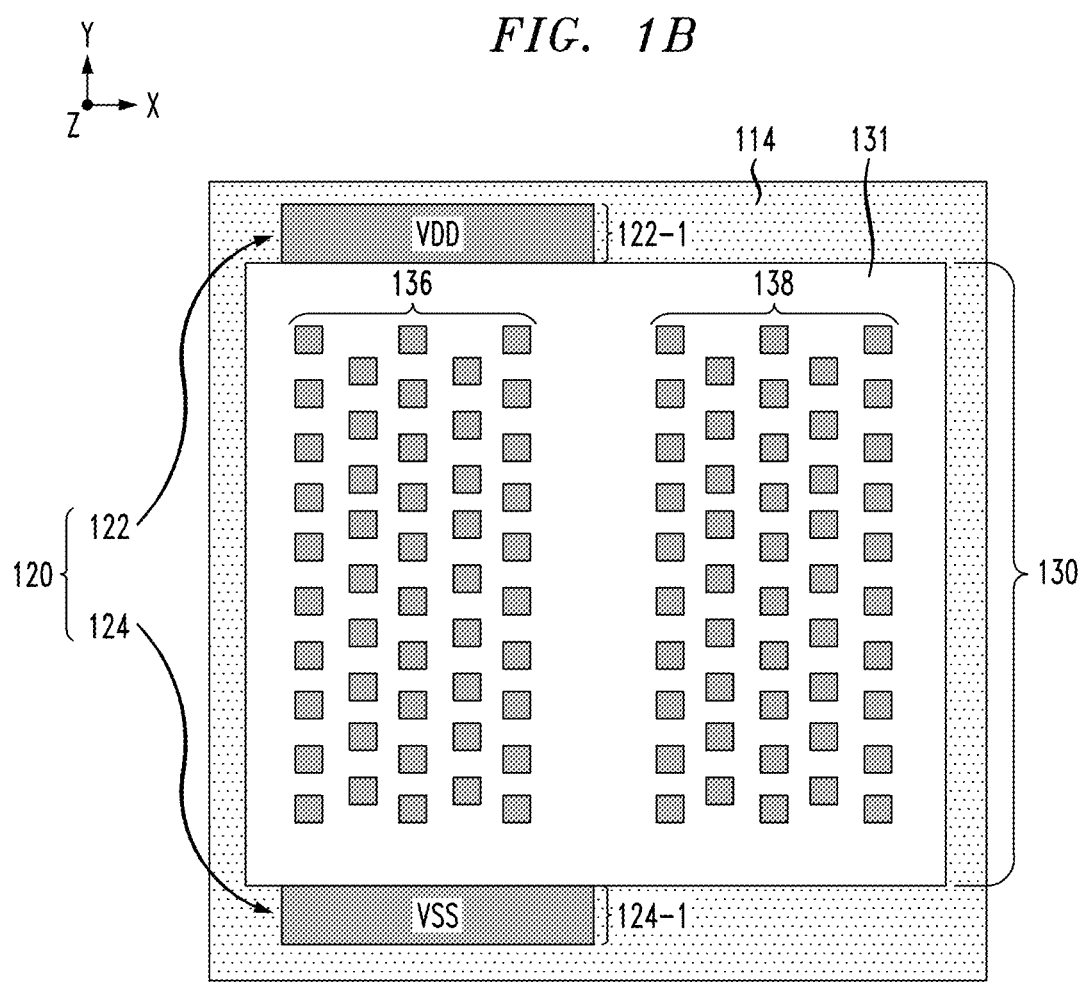
Figure 1C:
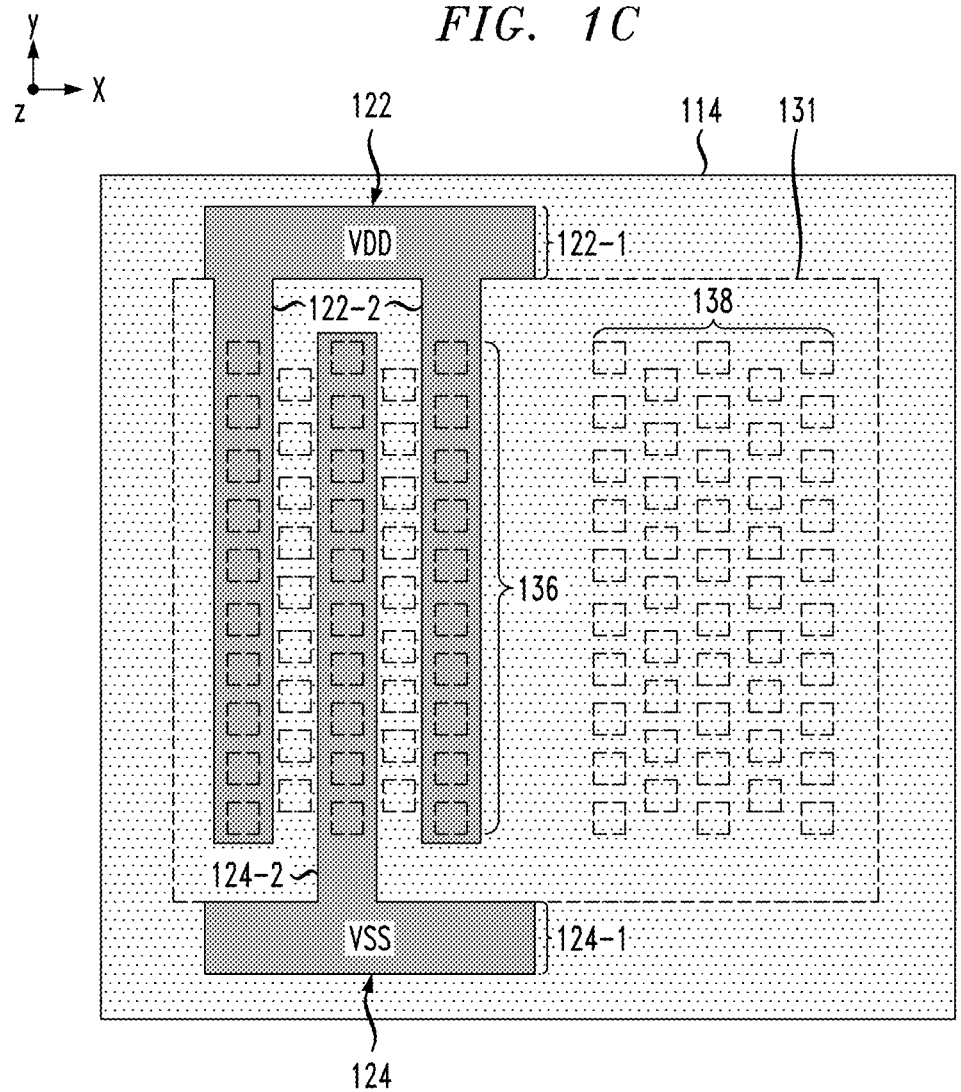

FIGS. 1A, 1B and 1C are schematic views of a chip interconnect bridge device 100 with an embedded power distribution network, according to an exemplary embodiment of the disclosure. More specifically, FIG. 1A is a schematic side view of the chip interconnect bridge device 100, FIG. 1B is a schematic top plan view of the chip interconnect bridge device 100 shown in FIG. 1A, and FIG. 1C is a plan view of the chip interconnect bridge device 100 along line 1C-1C in FIG. 1A. Referring to FIG. 1A, the chip interconnect bridge device 100 comprises a substrate 110, an embedded power distribution network 120, and a high-density interconnect structure 130. The substrate 110 comprises a base substrate layer 112 (e.g., silicon substrate or glass substrate) and an insulating layer 114. The power distribution network 120 comprises one or more power distribution planes that are disposed within the insulating layer 114. It is to be understood that while the power distribution network 120 and insulating layer 114 are generically illustrated, in some embodiments, the power distribution network 120 may comprise multiple power distribution planes disposed within multiple insulating layers, which are fabricated using, e.g., damascene processing or build up processing. The high-density interconnect structure 130 comprises an insulating layer 131, fine-pitch chip interconnect wiring 132, power distribution wiring 134, a first array of contact pads 136, and a second array of contact pads 138. The fine-pitch chip interconnect wiring 132 and the power distribution wiring 134 are comprised of a network of lateral wiring and vertical vias that are formed within insulating material 131, wherein the insulating material 131 comprises multiple dielectric layers. The first array of contact pads 136 and the second array of contact pads 138 are exposed on an upper surface of the interconnect structure 130.

In some embodiments, the high-density interconnect structure 130 is fabricated using state-of-the-art BEOL fabrication techniques, wherein the insulating layer 131 comprises a stack of inter-level dielectric (ILD) layers, and wherein the fine-pitch chip interconnect wiring 132 and the power distribution wiring 134 comprise metallization structures such as horizontal wiring and vertical via structures (and associated via landing pads) embedded within the ILD layers. The ILD layers can be formed using dielectric materials (e.g., low-k dielectrics) which are commonly used for BEOL fabrication, and the metallization structures are formed using metallic materials (e.g., copper) which are commonly used for BEOL fabrication.

The first and second contact pad arrays 136 and 138 are utilized to bond IC chips to the chip interconnect bridge device 100. In some embodiments, the first and second arrays of contact pads 136 and 138 are formed with a contact pitch of about 55 microns or less, depending on the packaging requirements and given application. As schematically illustrated in FIG. 1A, the fine-pitch chip interconnect wiring 132 provides lateral connections between contacts pads in the first and second contact pad arrays 136 and 138 to thereby provide high-density, high bandwidth I/O connectivity between the IC chips connected to the contact pad arrays 136 and 138 of the chip interconnect bridge device 100. In some embodiments, the fine-pitch chip interconnect wiring 132 is formed with line width and line spacing design rules of 10 microns or less (e.g., sub-micron line width and line spacing design rules).

As further schematically illustrated in FIG. 1A, the power distribution wiring 134 provides connections between the power distribution network 120 and some contacts pads of the first array of contact pads 136. In some embodiments, the power distribution wiring 134 provides vertical connections between the power distribution network 120 and some contact pads of the second array of contact pads 138, as needed for the given chip package configuration. In some embodiments, the power distribution network 120 comprises separate power distribution wiring to distribute negative power supply voltage (e.g., VSS or ground (GND)) and positive power supply voltage (e.g., VDD) contact pads within the first and/or second arrays of contact pads 134 and 136

For example, FIGS. 1B and 1C schematically illustrate an exemplary embodiment in which the embedded power distribution network 120 of the chip interconnect bridge device 100 comprises a first power distribution network 122 to distribute positive power supply voltage VDD, and a second power distribution network 124 to distribute negative power supply voltage VSS. As schematically shown in FIG. 1B, the first and second power distribution networks 122 and 124 comprise respective exposed portions 122-1 and 124-1, which are not covered by the high-density interconnect structure 130. As explained in further detail below, the exposed portions 122-1 and 124-1 serve as contact landing pads for wire bonds or injection molded solder connections to supply power to the chip interconnect bridge device 100 from a package substrate.

Furthermore, as schematically illustrated in FIG. 1C, the first and second power distribution networks 122 and 124 comprise respective extended portions 122-2 and 124-2 which extend beneath, and are covered by, the high-density interconnect structure 130. For illustrative purposes, the features (e.g., 131, 136, and 138) of the high-density interconnect structure 130 are shown in phantom with dashed-line outlines. The extended portions 122-2 and 124-2 extend from the respective exposed portions 122-1 and 124-1 to provide power distribution lines/traces below the array of contact pads 136. In this configuration, vertical power distribution wiring within the interconnect structure 130 provides connections from locations along the extended portions 122-2 and 124-2 to contact pads within the array of contact pads 136 which correspond to power pads (e.g., VDD and VSS pads) on the active surface of an IC chip that is to be bonded to the array of contact pads 136. As noted above, with high-density IC chip functionality and I/O, a plurality of power and ground pads may be included within the I/O area arrays to minimize IR-drop and ground bounce.

FIG. 1C illustrates an exemplary embodiment in which the first and second power distribution networks 122 and 124 are disposed on a same power distribution plane, and wherein the first and second power distribution networks 122 and 124 comprise a plurality of elongated interdigitated metallic wires 122-2 and 124-2, respectively, which are disposed in parallel, thereby forming an interdigitated or mesh-type power distribution network to distribute power in the foot print region of the contact pad array 136. It is to be understood that FIG. 1C illustrates a non-limiting exemplary embodiment of an embedded interdigitated or mesh-type pattern which can serve as an embedded power distribution network for distributing both positive and negative power supply voltage to the footprint region of the contact pad array 136. Other types of interdigitated or mesh-type patterns can be utilized using one or more stacked metallization layers to form an embedded power distribution network within a chip interconnect bridge device, as is readily understood contemplated by one of ordinary skill in the art.

Moreover, while FIGS. 1A, 1B and 1C schematically illustrate a non-limiting limiting exemplary embodiment of an embedded power distribution network 120 for distributing both positive and negative power supply voltage to the footprint region of the contact pad array 136, in other embodiments, a chip interconnect bridge device can be constructed to include an embedded power distribution network that is configured to distribute positive and negative power supply voltage to the footprint regions or two or more contact pad arrays of the chip interconnect bridge device. For example, FIG. 2 schematically illustrates an exemplary embodiment in which the embedded power distribution network 120 of the chip interconnect bridge device 100 of FIGS. 1A-1C is configured to distribute positive and negative power supply voltage to both contact pad arrays 136 and 138 of the chip interconnect bridge device 100.

Figure 2:
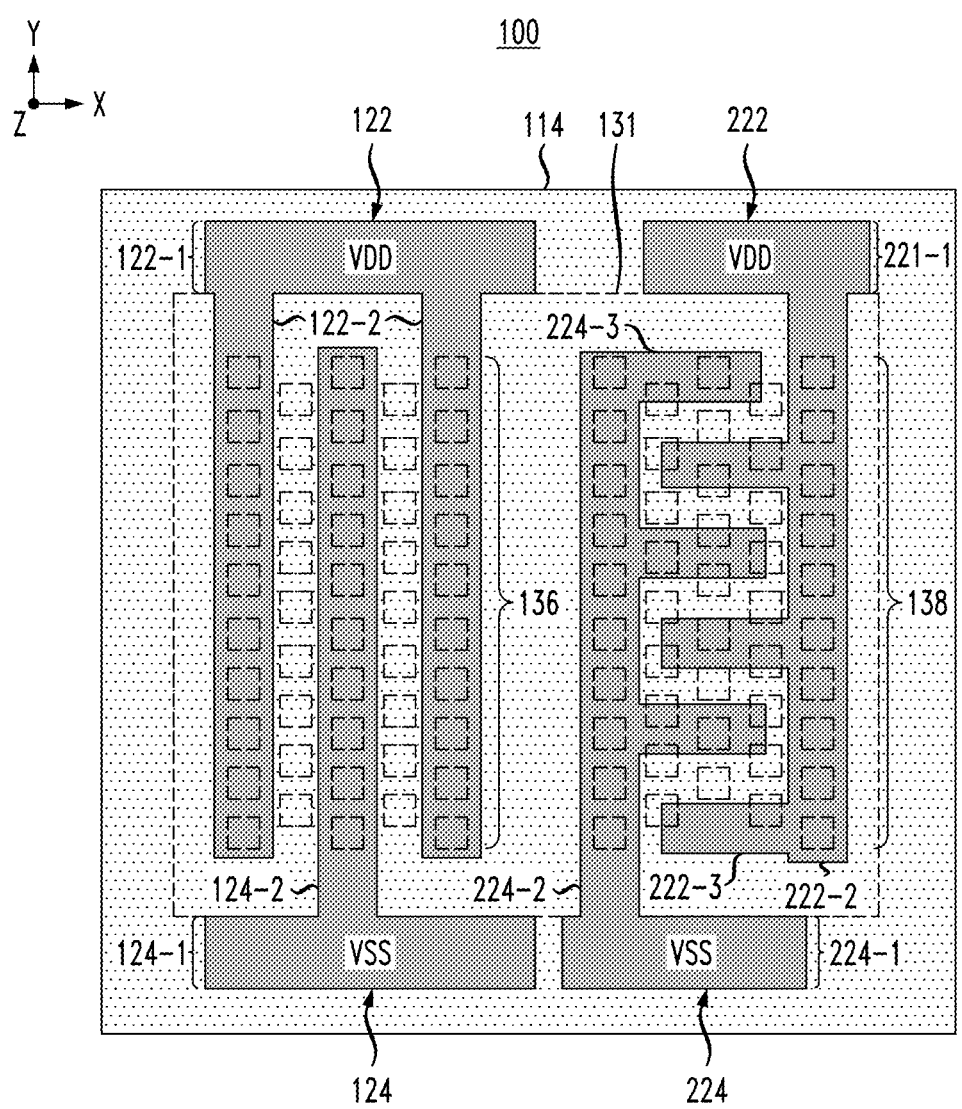
FIG. 2 is a plan view of a chip interconnect bridge device having an embedded power distribution network that is configured to distribute positive and negative power supply voltage to footprint regions or two or more contact pad arrays of the chip interconnect bridge device, according to another embodiment of the disclosure.

More specifically, in the exemplary embodiment of FIG. 2, additional power distribution networks 222 and 224 are provided to distribute positive power supply voltage VDD and negative power supply voltage VSS, respectively, to the footprint region of the contact pad array 138. The power distribution networks 222 and 224 comprise respective exposed portions 221-1 and 224-1 (not covered by the high-density interconnect structure 130) which serve as contact landing pads for wire bonds or injection molded solder connections to supply power to the chip interconnect bridge device 100 from a package substrate. Furthermore, as schematically illustrated in FIG. 2, the power distribution networks 222 and 224 comprise respective elongated extended portions 222-2 and 224-2 which extend beneath, and are covered by, the high-density interconnect structure 130. In addition, the elongated extended portions 222-2 and 224-2 each comprise a plurality of stub extensions 222-3 and 224-3, respectively, which extend from different locations along the respective elongated extended portions 222-2 and 224-2. The elongated extended portions 222-2 and 224-2 and respective stub extensions 222-3 and 224-3 provide power distribution lines/traces below the array of contact pads 138, wherein vertical power distribution wiring within the interconnect structure 130 is formed to provide connections from the elongated extended portions 222-2 and 224-2 and/or stub extensions 222-3 and 224-3 to target contact pads within the array of contact pads 138 which correspond to power pads on the active surface of the IC chip to be connected to the contact pad array 138.

It is to be understood the power distribution networks 222 and 224 shown in FIG. 2 illustrate another non-limiting exemplary embodiment of an embedded interdigitated or mesh-type pattern that can be implemented for distributing both positive and negative power supply voltage to a footprint region of a contact pad array. In addition, FIG. 2 illustrates an exemplary embodiment in which the power distribution networks 122 and 222 for distributing positive power supply voltage VDD are separate, and wherein the power distribution networks 124 and 224 for distributing negative power supply voltage VSS are separate. This allows different supply voltage levels to be utilized for different IC chips that are bonded to the first and second contact pad arrays 136 and 138.

On the other hand, when the IC chips that are connected to the first and second arrays of contact pads 136 and 138 utilize the same power supply voltage levels VDD and/or VSS, the VDD power distribution networks 122 and 222 can be integrally formed as a single integrated network to distribute positive power supply voltage VDD to both contact pad arrays 136 and 138. Similarly, the VSS power distribution networks 124 and 224 can be integrally formed as a single integrated network to distribute negative power supply voltage VSS to both contact pad arrays 136 and 138. For example, in the exemplary embodiment of FIG. 2, the exposed portions 122-1 and 221-1 can be patterned as a single continuous contact pad to distribute VDD power supply voltage to both contact pad arrays 136 and 138, and the exposed portions 124-1 and 224-1 can be patterned as a single continuous contact pad to distribute VSS power supply voltage to both contact pad arrays 136 and 138.

FIGS. 3A, 3B, and 3C are schematic views of a multi-chip package structure 300 comprising a chip interconnect bridge device, according to an embodiment of the disclosure. In particular, FIG. 3A is a schematic cross-sectional side view (X-Z plane) of the multi-chip package structure 300, FIG. 3B is a schematic top plan view (X-Y plan view) of the multi-chip package structure 300 of FIG. 3A, and FIG. 3C is a schematic cross-sectional side view (Y-Z plane) of the multi-chip package structure 300 along line 3C-3C shown in FIG. 3A. As shown in FIGS. 3A-3C, the multi-chip package structure 300 comprises package substrate 310, a chip interconnect bridge device 320, a first IC chip 330, and a second IC chip 340. For illustrative purposes, the chip interconnect bridge device 320 shown in FIGS. 3A, 3B, and 3C comprises the chip interconnect bridge device 100 of FIGS. 1A-1C.

The package substrate 310 comprises a recessed cavity 312 formed in an upper surface thereof, and the chip interconnect bridge device 320 is disposed within the recessed cavity 312. In some embodiments, the chip interconnect bridge device 320 is joined to the package substrate 310 using a die attach film 322 (e.g., adhesive layer) disposed between a bottom of the chip interconnect bridge device 320 and bottom surface of the recessed cavity 312. The package substrate 310 comprises a network of package traces 314 which extend through the package substrate 310. The package substrate 310 comprises an arrangement of contact pads 316 exposed on the upper surface thereof, and an array of solder ball contacts 318 (e.g., Ball Grid Array (BGA) solder contacts) disposed on a bottom surface of the package substrate 310. The network of package traces 314 provide wiring connections between the contacts pads 316 and the solder ball contacts 318 on the respective upper and bottom surfaces of the package substrate 310.

As shown in FIG. 3A, the first IC chip 330 is flip-chip attached to (i) the upper surface of the package substrate 310 using an array of solder bumps 332 that are bonded to some contact pads 316 on the upper surface of the package substrate and to (ii) the upper surface of the chip interconnect bridge device 320 using an array of solder bumps 334 that are bonded to the first array of contact pads 136 on the upper surface of the chip interconnect bridge device 320. Similarly, the second IC chip 340 is flip-chip attached to (i) the upper surface of the package substrate 310 using an array of solder bumps 344 that are bonded to some contact pads 316 on the upper surface of the package substrate 310 and to (ii) the upper surface of the chip interconnect bridge device 320 using an array of solder bumps 342 that are bonded to the second array of contact pads 138 on the upper surface of the chip interconnect bridge device 320.

As further illustrated in FIGS. 3A, 3B, and 3C, a plurality of wire bonds 350 are utilized to provide connections between contact pads 316 of the package substrate 310 to the embedded power distribution network 120 of the chip interconnect bridge device 320. More specifically, as shown in FIGS. 3B and 3C, one or more wire bonds 350 are implemented to provide a VDD supply power connection from at least one contact pad 316-1 to the embedded positive power supply distribution network 122 of the chip interconnect bridge device 320. Similarly, one or more wire bonds 350 are implemented to provide a VSS supply power connection from at least one contact pad 316-2 to the embedded negative power supply distribution network 124 of the chip interconnect bridge device 320. As shown in FIG. 3B, the wire bonds 350 are connected to the exposed portions 122-1 and 124-1 (exposed wire bond landing areas) of the respective power supply distribution networks 122 and 124.

In this configuration, the package traces 314 are utilized to feed VDD and VSS power supply voltage to the respective contact 316-1 and 316-2, and the wire bonds 350 feed VDD and VSS power supply voltage to the respective embedded power supply distribution networks 122 and 124. In addition, the power distribution traces 134 within the interconnect structure 131 of the interconnect bridge device 320, which are connected to the embedded power supply distribution networks 122 and 124, feed VDD and VSS power supply voltage to target solder bump connections with the array of solder bumps 334 of the first IC chip 330.

For a heterogeneous packaging application, the IC chips 330 and 340 may comprise any type integrated circuit and system to implement a given application. For illustrative purposes, the exemplary package structure 300 of FIGS. 3A-3C show two IC chips, wherein the first IC chip 330 comprises a high-bandwidth memory (HBM) dynamic random-access memory (DRAM) device, and wherein the second IC chip 340 comprises a hardware accelerator device. In other embodiments, the IC chips 330 and 340 (and other additional IC dies) may comprise one or more of a memory device, central processing unit (CPU), a microcontroller, an application-specific integrated circuit (ASIC), a field programmable gate array (FPGA), and other types of general purposes processors or work-load optimized processors such as graphics processing units (GPUs), digital signal processors (DSPs), system-on-chip (SoC), and other types of specialized processors or coprocessors that are configured to execute one or more fixed functions.

In some embodiments, a footprint of a given IC chip (e.g., the first IC chip 330) can substantially or completely overlap a footprint of the interconnect bridge device 320 such that all input/output, power/ground, and other connections between the given IC chip and the package substrate 310 is routed through the chip interconnect bridge device 320. Indeed, in some embodiments, there can be a small IC chip (relative to a large IC chip such as an accelerator (e.g., GPU)) which has a relatively small footprint such that the entire footprint of the IC chip is flip-chip mounted to the chip interconnect bridge device 320. In this instance, the chip interconnect bridge device 320 can be irregularly shaped (e.g., non-rectangular) in order to accommodate both the smaller and larger IC chips that are attached to the chip interconnect bridge device 320.

In some embodiments, the fine-pitch wiring 132 of the interconnect bridge device 320 is formed with sub-micron line-width and line-spacing design rules using, e.g., BEOL fabrication techniques. In some embodiments, the fine-pitch wiring 132 and power distribution traces 134 are constructed using thin film technology to build a stack of fine-pitch and/or coarse pitch organic redistribution layers. In some embodiments, the flip-chip solder connections 334 and 342 comprise micro-bumps to enable high density I/O signal communication between the adjacent IC chips 330 and 340, wherein the flip-chip micro-bump solder connections 334 and 342 are formed with a contact pitch of about 55 microns or less, depending on the application.

In some embodiments, the flip-chip solder bump connections 332 and 344 are coarser in pitch than the flip-chip micro-bump solder connections 334 and 342. For example, in some embodiments, the solder bump connections 332 and 344 formed with a contact pitch of about 75 microns or greater, depending on the application. In other embodiments, the solder bumps 332 of the first IC chip 330 can be micro-bumps (e.g., 55 microns or less), and the solder connections 344 of the second IC chip 340 could have mixed pitch solder bumps with some bumps having a pitch of 100 microns or greater, while other bumps in the region near the interconnect bridge 320 have a fine pitch of 55 microns or less. In other embodiments, the first and second IC chips 330 and 340 can have mixed pitch solder bumps. In other embodiments, all of the solder bumps connections 332, 334, 342, and 344 can have a fine pitch (e.g., 55 microns or less). The solder ball connections 318 (e.g., BGA) on the bottom side of the package substrate 310 are formed with a contact pitch of about 100 microns or greater, depending on the application.

While the flip-chip bump connections 332, 334, 342, and 344 are generically depicted in the drawings for ease of illustration, it is to be understood that the flip-chip bump connections 332, 334, 342, and 344 can be implemented using any suitable flip-chip bump technology. For example, the flip-chip bump connections can be implemented using controlled collapse chip connection (C4) flip-chip bump technology where solder balls are formed on ball limiting metallurgy (BLM) pads or under bump metallization (UBM) pads. The solder balls can be formed by solder paste printing or electroplating. In other embodiments, the flip-chip bump connections can be chip connection (C2) bumps comprising metallic pillar structures (e.g. copper pillars) that are formed on metal pads. The metallic pillar bump structures may or may not have solder endcaps. In other embodiments, the flip-chip bump connections can be C2 bumps with plated metal formed on UBM pads.

In other embodiments, solder micro-bumps comprising Cu and Sn can be electroplated on UBM pads, wherein the UBM pads comprise electroless plated nickel and immersion gold. The joining of the two flip-chip elements can be performed by joining CuSn solder micro bumps on one flip-chip element to UBM pads on another flip-chip element, or by joining CuSn solder micro bumps on one flip-chip element to CuSn solder micro bumps on another flip-chip element. In other embodiments, an area array of copper pillar bumps on one flip-chip element can be bonded to an area array of solder balls on another flip-chip element. In addition, an area array of high-temperature solder bumps formed on UBM pads on one flip-chip element can be joined to an area array of low temperature solder bumps formed on contact pads of another flip-chip element.

Figure 3D:
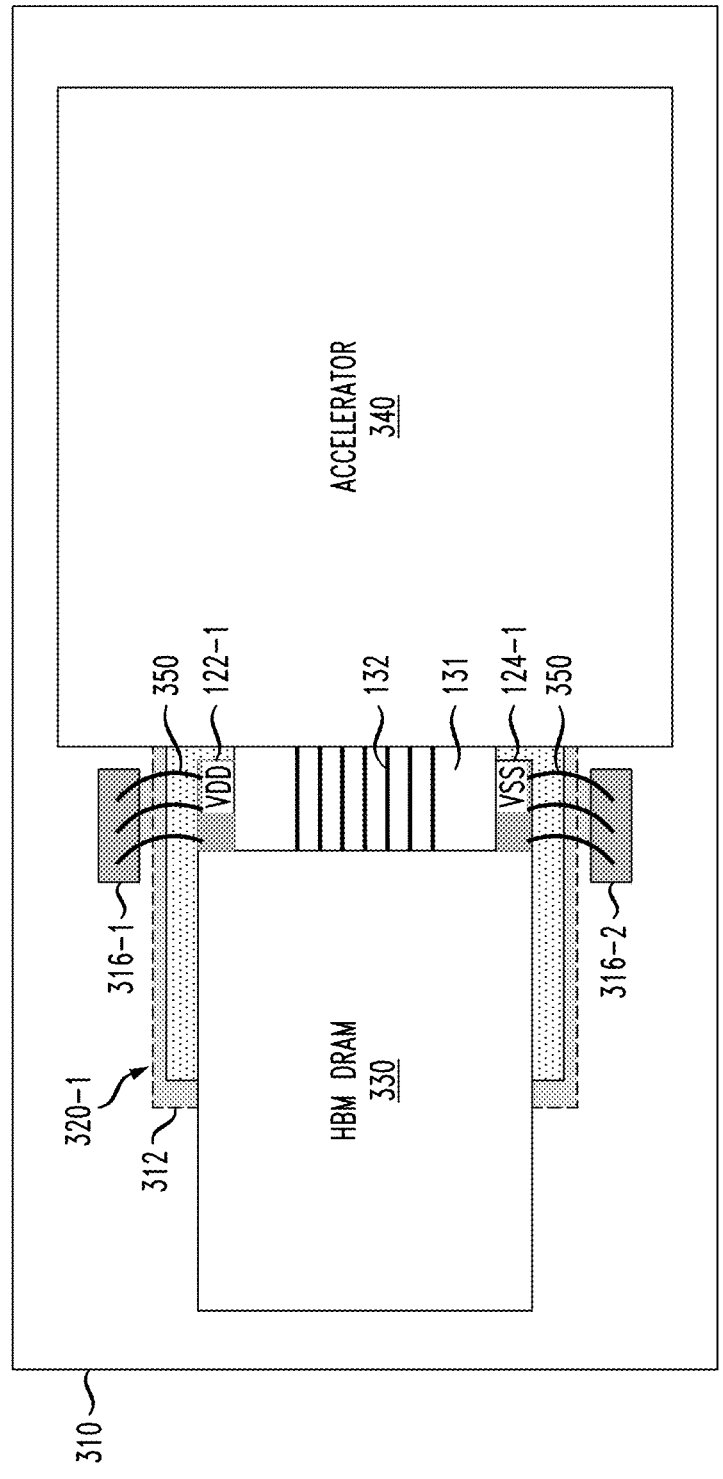
FIG. 3D is a schematic top plan view of a multi-chip package structure comprising a chip interconnect bridge device, according to another embodiment of the disclosure.

FIG. 3D is a schematic top plan view of a multi-chip package structure comprising a chip interconnect bridge device, according to another embodiment of the disclosure. In particular, FIG. 3D is a schematic top plan view (X-Y plane) of a multi-chip package structure 301 which is similar to the multi-chip package structure 300 shown in FIG. 3B, except that a chip interconnect bridge device 320-1 in FIG. 3D is shown to have a smaller footprint than the multi-chip package structure 320 shown in FIG. 3B. In this embodiment, the exposed portions 122-1 and 124-1 of the respective VDD and VSS power distribution networks 122 and 124 are disposed in a region between the first and second IC chips 330 and 340, wherein ends of the wire bonds 350 in contact with the exposed portions 122-1 and 124-1 are also disposed in the region between the first and second IC chips 330 and 340.

FIG. 4 is a schematic cross-sectional side view (X-Z plane) of a multi-chip package structure 400 comprising a chip interconnect bridge device, according to another embodiment of the disclosure. The multi-chip package structure 400 of FIG. 4 is similar to the multi-chip package structure 300 shown in FIG. 3A except that the multi-chip package structure 400 in FIG. 4 further comprises a pre-applied underfill layer 410 disposed between the upper surface of the chip interconnect bridge device 320 and the overlapping portions of the active surfaces of the first and second IC chips 330 and 340, wherein the pre-applied underfill layer 410 encapsulates the solder bump connections 334 and 342.

In some embodiments, the pre-applied underfill layer 410 is formed on the upper surface of the chip interconnect bridge device 320 prior to solder bonding the first and second IC chips 330 and 340 to the chip interconnect bridge device 320. In this instance, the pre-applied underfill layer 410 is formed with a desired thickness on the upper surface of the high-density interconnect structure 130 and covering the first and second arrays of contact pads 136 and 138. In some embodiments, the pre-applied underfill layer 410 comprises a no-flow fluxing underfill material such as a polymer paste adhesive (e.g., epoxy material) having a fluxing ingredient that assists in making the solder bump connections 334 and 342 during solder reflow of the solder balls formed on the active sides of the first and second IC chips 330 and 340. In other embodiments, the pre-applied underfill layer 410 may comprise an insulative thermoplastic preformed film which under pressure and heat, softens and flows around the solder bumps, and then solidifies on cooling.

In this embodiment, pre-applied underfill layer 410 adds structural integrity to the solder bump connections 334 and 342 during assembly of the multi-chip package structure 400 but does not impede the wire bonding process that is used to connect the wire bonds to the exposed portions 122-1 and 124-1 of the embedded VDD and VSS power distribution networks 122 and 124 of the chip interconnect bridge device 320. The use of the pre-applied underfill layer 410 is particularly advantageous when the IC chips 330 and 340 and chip interconnect bridge device 320 are initially joined to form a chip/bridge assembly, wherein the chip/bridge assembly is then joined to the package substrate 310, followed by wire bonding and capillary underfill. In the exemplary embodiments of FIGS. 3A and 4, following the wire bonding process, a capillary underfill process can be performed to fill the voids/spaces between package substrate 310 and the IC chips 330 and 340, and between the chip interconnect bridge device 320 and the sidewalls of the etched recessed cavity 312, with underfill material. In this instance, the capillary underfill material will also encapsulate end portions of the wire bonds 350 which are connected to the exposed portions 122-1 and 124-1 of the embedded power distribution networks 122 and 124 of the interconnect bridge device 320.

Figure 5A:
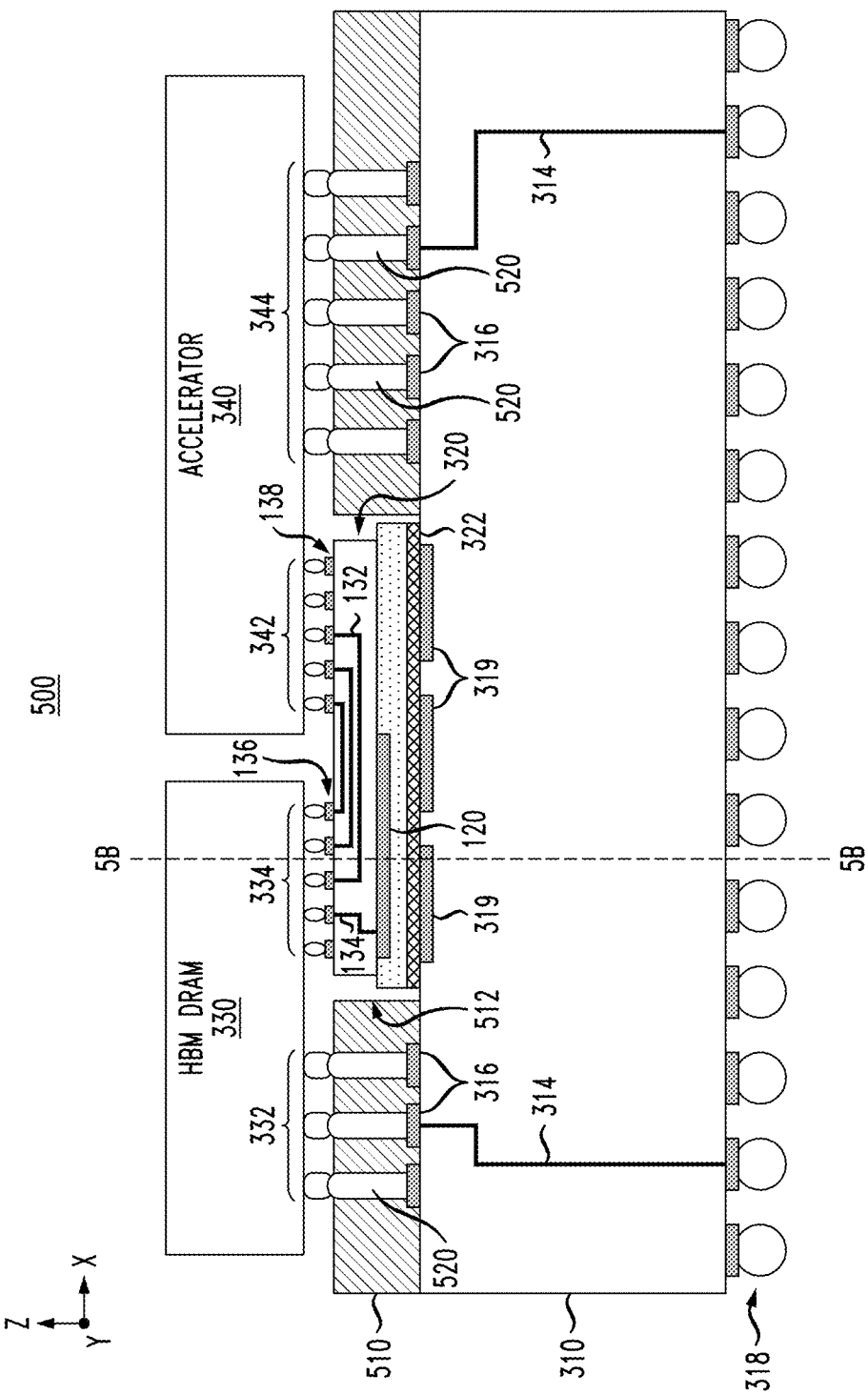
FIG. 5A is a schematic cross-sectional side view of a multi-chip package structure comprising a chip interconnect bridge device, according to an embodiment of the disclosure.
Figure 5B:
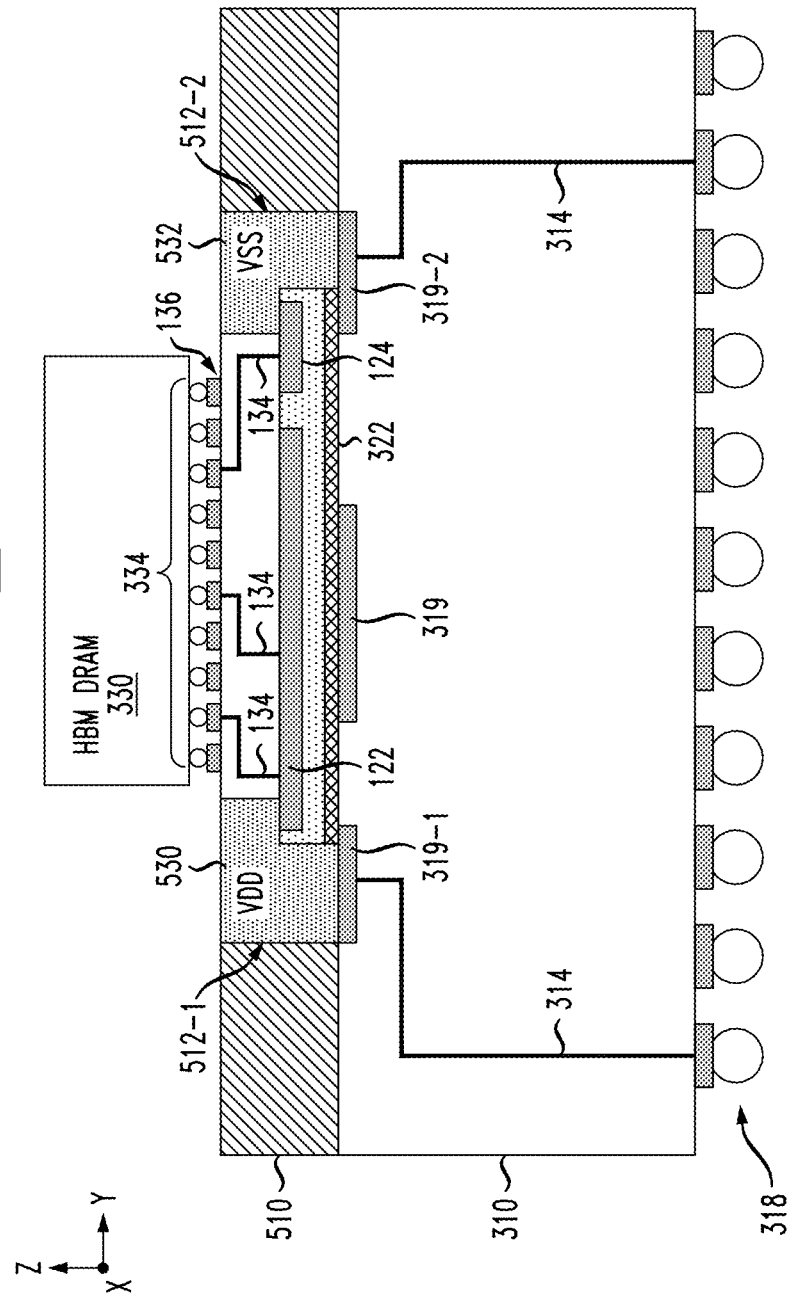
FIG. 5B is a schematic cross-sectional side view of the multi-chip package structure of FIG. 5A along line 5B-5B shown in FIG. 5A.

FIGS. 5A and 5B are schematic views of a multi-chip package structure 500 comprising a chip interconnect bridge device, according to an embodiment of the disclosure. In particular, FIG. 5A is a schematic cross-sectional side view (X-Z plane) of the multi-chip package structure 500 and FIG. 5B is a schematic cross-sectional side view (Y-Z plane) of the multi-chip package structure 500 along line 5B-5B shown in FIG. 5A. The multi-chip package structure 500 shown in FIGS. 5A and 5B is similar to the multi-chip package structure 300 shown in FIGS. 3A-3C, except that the multi-chip package structure 500 utilizes injection molded solder (instead of wire bonds 350) to provide VDD and VSS connections from the package substrate 310 to the embedded power distribution network 120 of the chip interconnect bridge device 320.

In particular, as shown in FIGS. 5A and 5B, the multi-chip package structure 500 comprises a patterned solder mask 510 disposed on the upper surface of the package substrate 310. The patterned solder mask 510 comprises an opening 512, wherein the chip interconnect bridge device 320 is disposed within the solder mask opening 512 and attached to the surface of the package substrate 310 using the die attach film 322. The patterned solder mask 510 further comprises openings that are formed to expose the underlying contact pads 316 of the package substrate 310, wherein the openings are filled with solder pillars 520. The solder pillars 520 are configured to bond to the solder bumps 332 and 344 on the active surfaces of the first and second chips 330 and 340.

As further shown in FIGS. 5A and 5B, the package substrate 310 comprises metallization of an upper redistribution layer (RDL) 319 which is disposed below and around a perimeter of bottom surface of the chip interconnect bridge device 320. As specifically shown in FIG. 5B, the RDL 319 comprises a first RDL contact 319-1 and a second RDL contact 319-2, which are at least partially exposed through different regions 512-1 and 512-2 of the solder mask opening 512. The multi-chip package structure 500 comprises first and second injected molded solder connections 530 and 532, which are disposed within separated open regions of the solder mask opening 512. The injected molded solder connection 530 provides a connection between the exposed portion of the first RDL contact 319-1 and the exposed portion 122-1 of the embedded VDD power distribution network 122 of the chip interconnect bridge device 320. The injected molded solder connection 532 provides a connection between the exposed portion of the second RDL contact 319-2 and the exposed portion 124-1 of the embedded VSS power distribution network 124 of the chip interconnect bridge device 320.

In the exemplary embodiment of FIGS. 5A and 5B, the injection molded solder connections 530 and 532 are separated and insulated from each other. For example, in some embodiments, the solder mask opening 512 is patterned to snuggly fit the footprint of the chip interconnect bridge device 320, and also patterned to have wider open regions 512-1 and 512-2 which are formed adjacent to the exposed contact portions 122-1 and 124-1 of the VDD and VSS power distribution networks 122 and 124, and which are filled to form the injection molded solder connections 530 and 532. In other words, the injection molded solder is not disposed around the entire perimeter of the chip interconnect bridge device 320, but rather the solder mask opening 512 is formed such that the wider open regions 512-1 and 512-2 are separate and insulated from each other.

In an alternate embodiment of FIGS. 3A-3B, the injection molded solder connections 530 and 532 can be utilized in place of the wire bonds 350 to make VDD and VSS connections to the chip interconnect bridge device 320. In this instance, the recessed cavity 312 can be formed in the upper surface of the package substrate 310 to expose underlying RDL metallization structures which are connected to package traces 314 that route VDD and VSS power supply to the RDL metallization. In particular, the RDL metallization 319-1 and 319-2 as shown in FIG. 5B can be a portion of an RDL layer that is exposed at a bottom of the recessed cavity 312 of the package substrate 310. In this embodiment, the injection molded solder connections 530 and 532 can be formed within separate recessed regions of the recessed cavity 312 to provide VDD and VSS connections from the exposed RDL metallization of the package substrate 310 and the embedded power distribution networks of the chip interconnect bridge device 320.

FIG. 6 is a schematic cross-sectional side view (Y-Z plane) of a multi-chip package structure 600 comprising a chip interconnect bridge device, according to another embodiment of the disclosure. The multi-chip package structure 600 of FIG. 6 is similar to the multi-chip package structure 500 shown in FIG. 5B except that the first and second injected molded solder connections 530 and 532 are formed in contact with contact pads 316-1 and 316-2 on the upper surface of package substrate 310. In this exemplary embodiment, the solder mask opening 512 is patterned such that the wider open regions 512-1 and 512-2 are formed to expose at least portions of the underlying contact pads 316-1 and 316-2. In the exemplary embodiment of FIG. 6, the injection molded solder connections 530 and 532 are utilized in place of the wire bonds 350 as shown, for example, in the exemplary embodiment of FIGS. 3A-3C.

Figure 7A:
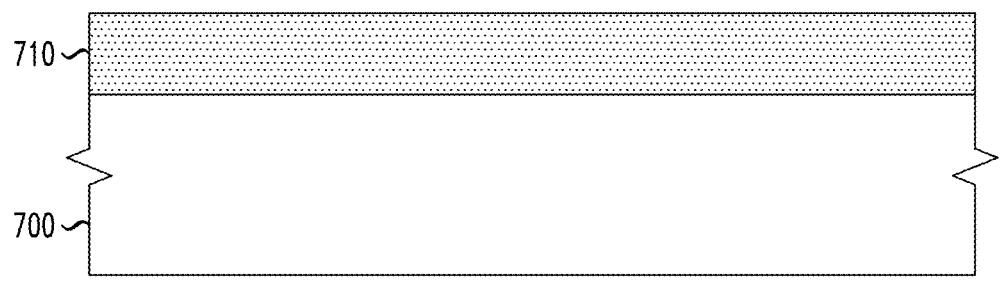

FIGS. 7A, 7B, 7C, 7D, and 7E schematically illustrate a method for fabricating a chip interconnect bridge device with an embedded power distribution network, according to an embodiment of the disclosure. To begin, FIG. 7A is a cross-sectional side view of an interconnect bridge structure at an intermediate stage of fabrication comprising a bridge substrate 700 and a dielectric layer 710 formed on the surface of the bridge substrate 700. In some embodiments, the bridge substrate 700 can be a glass substrate (e.g., glass wafer) or a silicon substrate (e.g., silicon wafer). In some embodiments, the dielectric layer 710 is an oxide layer (e.g., silicon oxide) that is deposited on the upper surface of the bridge substrate 700. The thickness of the dielectric layer 710 will vary depending on the desired thickness of metallization of the embedded power distribution network and the number of metallization levels that are used to form the embedded power distribution network.

Figure 7B:
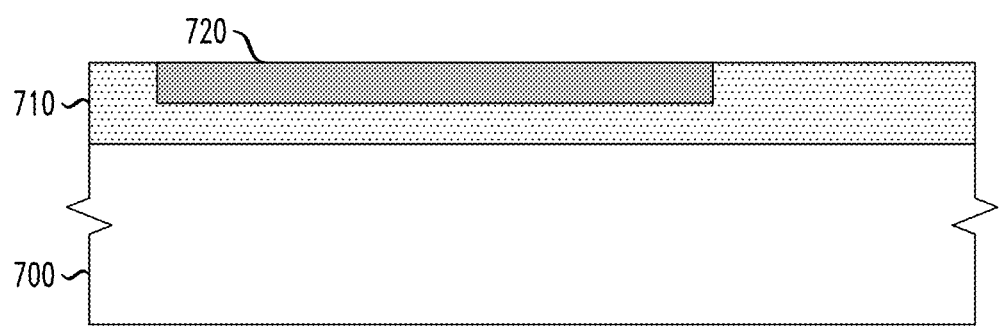

Next, FIG. 7B is a cross-sectional side view of the intermediate structure of FIG. 7A after forming an embedded power distribution network 720 within the dielectric layer 710. The embedded power distribution network 720 can be fabricated using various methods. For example, in some embodiments, the dielectric layer 710 is photolithographically patterned to form a trench pattern which defines a metallization pattern of the power distribution network 720. The power distribution network 720 is then fabricated by depositing a conformal liner layer to line the sidewall and bottom surfaces of the trench(es), followed by depositing a layer of metallic material to fill the trench(es) with metallic material. The conformal liner layer comprises one or more conformal layers of materials that are commonly used to form, e.g., diffusion barrier layers and seed layers. In some embodiments, the metallization of the power distribution network 720 comprises copper, tungsten, or other suitable metallic materials that may be used to form the embedded power distribution network 720. Following the deposition of the liner and metallic layers, a CMP process is performed to remove the overburden material and planarize the surface of the intermediate structure down to the dielectric layer 710.

While the power distribution network 720 is generically depicted in FIG. 7B for ease of illustration, it is to be understood that the embedded power distribution network 720 can be formed to have any desired pattern which is suitable to distribute positive and/or negative power supply voltage, as discussed above. For example, the power distribution network 720 can have interdigitated and/or mesh patterns that are the same or similar to those depicted in FIGS. 1C and 2. In addition, while only one metallization level is shown in FIG. 7B for ease of illustration, the power distribution network 720 can be formed of multiple metallization levels, as desired for a given application. In some embodiments, additional processing is performed on the metallization of the power distribution network 720 to enable formation of reliable contact between the wire bonds or injection molded solder to the exposed metallization of the power distribution network 720. For example, the metallization of the power distribution network 720 can be capped or treated with any suitable metallurgy to enable bonding, etc.

Figure 7C:
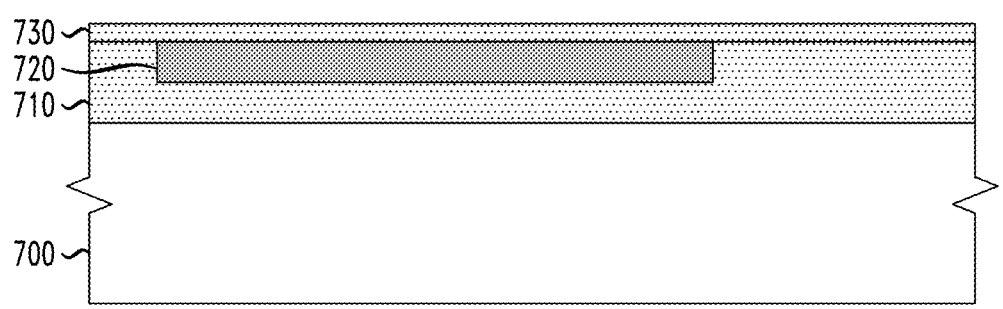

Next, FIG. 7C is a cross-sectional side view of the intermediate structure of FIG. 7B after forming dielectric capping layer 730 on the upper surface thereof to cover the exposed metallization of the power distribution network 720. In some embodiments, the dielectric capping layer 730 comprises a nitride material (e.g., silicon nitride), or any other dielectric material which is suitable to protect the metallization of the power distribution network 720 and prevent diffusion of the metallic material of the power distribution network 720 into upper levels of insulating material that is subsequently formed to provide a high-density interconnect structure.

Figure 7D:
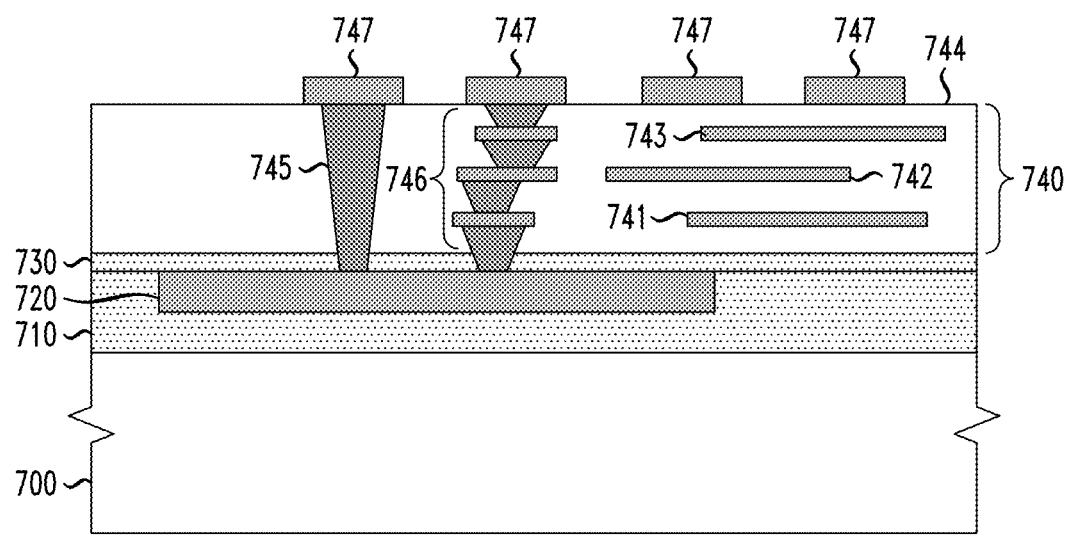

Next, FIG. 7D is a cross-sectional side view of the intermediate structure of FIG. 7C after forming an interconnect structure 740 over the embedded power distribution network 720. The interconnect structure 740 comprises multiple levels of fine-pitch wiring 741, 742, and 743 embedded in multiple layers of dielectric material 744. In addition, the interconnect structure 740 comprises a plurality of via structures 745 and 746, and an array of contact pads 747 formed on an upper surface of the interconnect structure 740. The via structures 745 and 746 provide vertical connections between the embedded power distribution network 720 and individual contact pads 747.

The via structures 745 and 746 may have different structural configurations, depending on the power distribution routing that is needed within the interconnect structure 740 to form connections between the embedded power distribution network 720 and individual contact pads 747. For example, the via structure 745 schematically illustrates an exemplary embodiment of a via structure which comprises a tall, continuous via structure that is formed through the dielectric layers 744 directly to the embedded power distribution network 720. On the other hand, the via structure 746 schematically illustrates an exemplary embodiment of a stacked via structure which is formed by multiple levels of interlevel via structures and metallization (e.g., landing pads) to form a vertical power distribution trace that provides an offset between the location of the target contact pad 747 and the connecting location on the embedded power distribution network 720. Other types of via structures and configurations may be utilized to achieve the desired power distribution wiring.

In some embodiments, the interconnect structure 740 is formed using state-of-the-art BEOL processing techniques wherein the dielectric material 744 comprises multiple interlevel dielectric (ILD) layers and metallization levels (e.g. copper metallization) that are deposited and patterned to form the vertical vias 745 and 746 (and associated via landing pads) and horizontal wiring 741, 742 and 743 embedded within the ILD layers. The ILD layers can be formed using dielectric materials which are commonly used for BEOL fabrication, including, but not limited to, silicon oxide, hydrogenated silicon carbon oxide (SiCOH), SiCH, SiCNH, or other types of silicon based low-k dielectrics (e.g., k less than about 4.0), porous dielectrics, or known ULK (ultra-low-k) dielectric materials (with k less than about 2.5).

Figure 7E:
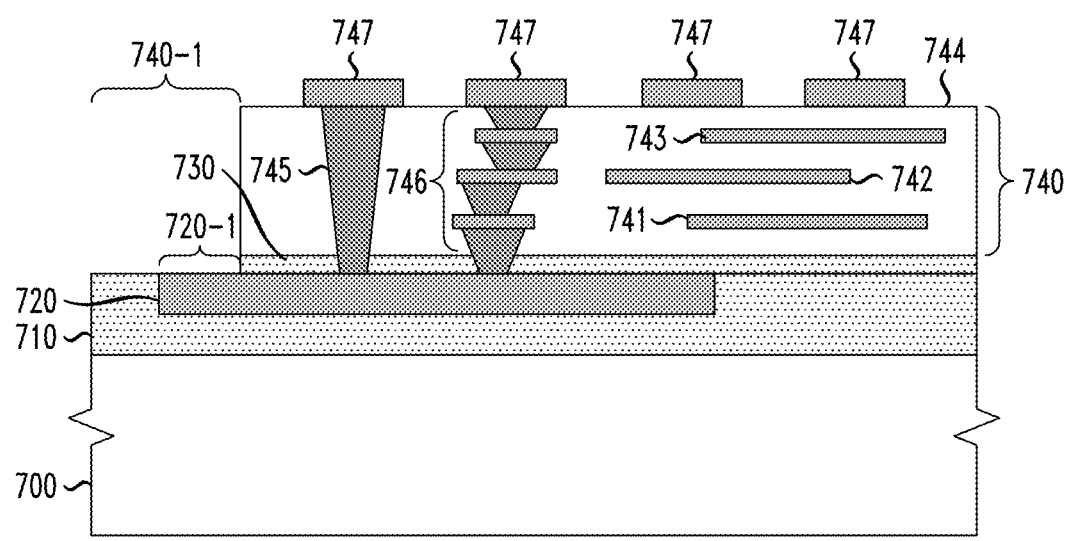

Next, FIG. 7E is a cross-sectional side view of the intermediate structure of FIG. 7D after patterning the interconnect structure 740 and the capping layer 730 to form an opening 740-1 which exposes a portion 720-1 of the embedded power distribution network 720. In particular, as schematically illustrated in FIG. 7E, the interconnect structure 740 is lithographically patterned to form an opening 740-1 through an area of the interconnect structure 740 which is devoid of wiring or via structures. As in the exemplary embodiments discussed above, the exposed portion 720-1 of the embedded power distribution network 720 is used as a contact area for connecting wire bonds or injected molded solder contacts to the embedded power distribution network 720. Following the formation of the intermediate structure shown in FIG. 7E, a backside grinding process is performed to thin down the bridge substrate 700, followed by a wafer-level dicing process to separate the individual bridge devices that are concurrently formed as part of the wafer-level process shown in FIGS. 7A-7E.

In other embodiments, a high-density interconnect structure (e.g., interconnect structure 740) of a bridge interconnect device can be fabricated using other suitable techniques instead of, or in combination with, BEOL processing. For example, in some embodiments, a high-density interconnect structure of a chip interconnect bridge device can be fabricated using a semi-additive process (SAP) RDL process. In other embodiments, the interconnect structure, or a portion thereof, can be formed using fine-pitch organic laminate build-up layers in which the insulating layers (e.g., layers 744) are formed of an organic material (e.g. polyimide, FR4, etc.). The use of organic build-up layers facilitates the fabrication of thicker wiring and interconnects for purposes of power distribution through the bridge structures, while also providing vertical via connectivity from the top-side contact pads 747 to the embedded power distribution network 720.

Although exemplary embodiments have been described herein with reference to the accompanying figures, it is to be understood that the disclosure is not limited to those precise embodiments, and that various other changes and modifications may be made therein by one skilled in the art without departing from the scope of the appended claims.

We claim:

1. A package structure comprising:
an interconnect bridge device;
a first integrated circuit chip, the first integrated circuit chip being flip-chip attached to at least the interconnect bridge device;
a package substrate;
a second integrated circuit chip, the second integrated circuit chip being flip-chip attached to the interconnect bridge device and to the package substrate; and
a connection structure;
wherein the interconnect bridge device comprises:
 a bridge substrate;
 an interconnect structure; and
 an embedded power distribution network disposed between the bridge substrate and the interconnect structure;
wherein the interconnect structure comprises:
 a first array of contact pads and a second array of contact pads disposed on an upper surface of the interconnect structure;
 wiring that is configured to provide chip-to-chip connections between the first and second integrated circuit chips; and
 power distribution wiring that provides connections between the embedded power distribution network and one or more contact pads of at least one of the first array of contact pads and the second array of contact pads;
wherein the embedded power distribution network is configured to distribute at least one of a positive power supply voltage and a negative power supply voltage to at least one of the first and second integrated circuit chips attached to the interconnect bridge device;
wherein the first integrated circuit chip is flip-chip bonded to the first array of contact pads;
wherein the second integrated circuit chip is flip-chip bonded to the second array of contact pads; and
wherein the connection structure connects the embedded power distribution network to a power supply voltage contact of the package substrate.

2. The package structure of claim 1, wherein the embedded power distribution network comprises a first power distribution network configured to distribute positive power supply voltage, and a second power distribution network configured to distribute negative power supply voltage.

3. The package structure of claim 2, wherein the first and second power distribution networks comprise interdigitated patterns of metallization.

4. The package structure of claim 1, wherein the interconnect bridge device comprises a build-up of multiple layers of inorganic dielectric material and multiple levels of patterned metallization and interlayer vias which form the chip-to-chip wiring and the power distribution wiring of the interconnect bridge device.

5. The package structure of claim 4, wherein the interconnect structure comprises a back-end-of-line structure that is fabricated using a back-end-of-line fabrication process.

6. The package structure of claim 1, wherein the first integrated circuit chip comprises a memory chip and wherein the second integrated circuit chip comprises a processor chip.

7. The package structure of claim 1, wherein a footprint of the first integrated circuit chip completely overlaps a footprint of the interconnect bridge device such that all input/output to the first integrated circuit chip is routed through the interconnect bridge device.

8. The package structure of claim 1, wherein at least a portion of the first integrated circuit chip is flip-chip attached to the package substrate.

9. The package structure of claim 1, wherein the package substrate comprises one of a ceramic substrate and an organic laminate build-up substrate.

10. The package structure of claim 1, wherein the connection structure comprises one of a wire bond and an injection molded solder connection.

11. A package structure comprising:
an interconnect bridge device;
a first integrated circuit chip, the first integrated circuit chip being flip-chip attached to at least the interconnect bridge device;
a package substrate;
a second integrated circuit chip, the second integrated circuit chip being flip-chip attached to the interconnect bridge device and to the package substrate; and a connection structure;
wherein the interconnect bridge device comprises (i) wiring that is configured to provide chip-to-chip connections between the first and second integrated circuit chips and (ii) an embedded power distribution network that is configured to distribute at least one of a positive power supply voltage and a negative power supply voltage to at least one of the first and second integrated circuit chips attached to the interconnect bridge device;
wherein the connection structure connects the embedded power distribution network to a power supply voltage contact of the package substrate; and
wherein the connection structure comprises a wire bond.

12. The package structure of claim 11, wherein:
the interconnect bridge device is disposed within a recessed cavity formed in an upper surface of the package substrate;
a portion of the embedded power distribution network of the interconnect bridge device is exposed; and
the wire bond connects the exposed portion of the embedded power distribution network to the power supply voltage contact on an upper surface of the package substrate.

13. A package structure comprising:
an interconnect bridge device;
a first integrated circuit chip, the first integrated circuit chip being flip-chip attached to at least the interconnect bridge device;
a package substrate;
a second integrated circuit chip, the second integrated circuit chip being flip-chip attached to the interconnect bridge device and to the package substrate; and
a connection structure;
wherein the interconnect bridge device comprises (i) wiring that is configured to provide chip-to-chip connections between the first and second integrated circuit chips and (ii) an embedded power distribution network that is configured to distribute at least one of a positive power supply voltage and a negative power supply voltage to at least one of the first and second integrated circuit chips attached to the interconnect bridge device;
wherein the connection structure connects the embedded power distribution network to a power supply voltage contact of the package substrate; and
wherein the connection structure comprises an injection molded solder connection.

14. The package structure of claim 13, wherein:
the interconnect bridge device is disposed within a recessed cavity formed in an upper surface of the package substrate;
a portion of the embedded power distribution network of the interconnect bridge device is exposed; and
the injection molded solder connection is disposed within a region of the recessed cavity, and connects the exposed portion of the embedded power distribution network to the power supply voltage contact exposed at a bottom surface of the recessed cavity of the package substrate.

15. The package structure of claim 13, further comprising:
a solder mask layer disposed on an upper surface of the package substrate, wherein the solder mask layer comprises a solder mask opening that exposes a portion of the upper surface of the package substrate;
wherein the interconnect bridge device is disposed within the solder mask opening, and wherein a portion of the embedded power distribution network of the interconnect bridge device is exposed; and
wherein the injection molded solder connection is disposed within a region of the solder mask opening, and connects the exposed portion of the embedded power distribution network to the power supply voltage contact on the exposed portion of the upper surface of the package substrate.

16. The package structure of claim 13, further comprising:
a solder mask layer disposed on an upper surface of the package substrate, wherein the solder mask layer comprises a solder mask opening that exposes a portion of the upper surface of the package substrate;
wherein the interconnect bridge device is disposed within the solder mask opening, and wherein a portion of the embedded power distribution network of the interconnect bridge device is exposed; and
wherein the injection molded solder connection is disposed within a region of the solder mask opening, and connects the exposed portion of the embedded power distribution network to the power supply voltage contact, wherein the power supply voltage contact comprises exposed metallization of a routing distribution layer in the upper surface of the package substrate.

17. A bridge device, comprising:
a bridge substrate;
an interconnect structure; and
an embedded power distribution network disposed between the bridge substrate and the interconnect structure;
wherein the interconnect structure comprises:
a first array of contact pads and a second array of contact pads disposed on an upper surface of the interconnect structure;
high-density wiring that provides connections between contacts pads of the first array of contact pads and the second array of contact pads; and
power distribution wiring that provides connections between the embedded power distribution network and one or more contact pads of at least one of the first array of contact pads and the second array of contact pads; and
wherein the interconnect structure comprises an opened region which exposes a portion of the embedded power distribution network, wherein the exposed portion of the embedded power distribution network comprises a contact area that is configured to enable a connection of supply voltage to the embedded power distribution network.

18. The bridge device of claim 17, wherein the embedded power distribution network comprises a first power distribution network configured to distribute positive power supply voltage, and a second power distribution network configured to distribute negative power supply voltage.

19. The bridge device of claim 18, wherein the first and second power distribution networks comprise interdigitated patterns of metallization.

20. A method for constructing a bridge device;
forming a dielectric layer on a substrate;
forming an embedded power distribution network within the dielectric layer;
forming an interconnect structure over the embedded power distribution network, wherein the interconnect structure comprises (i) a first array of contact pads and a second array of contact pads disposed on an upper surface of the interconnect structure, (ii) high-density wiring that provides connections between contacts pads of the first array of contact pads and the second array of contact pads, and (iii) power distribution wiring that provides connections between the embedded power distribution network and one or more contact pads of at least one of the first array of contact pads and the second array of contact pads; and patterning the interconnect structure to form an opening that exposes a portion of the embedded power distribution network, wherein the exposed portion of the embedded power distribution network comprises a contact area that is configured to enable a connection of supply voltage to the embedded power distribution network.

* * * * *